United States Patent
Huang et al.

(10) Patent No.: US 10,917,130 B1
(45) Date of Patent: Feb. 9, 2021

(54) SIGNAL RECEIVING APPARATUS AND METHOD HAVING ANTI-RFI MECHANISM

(71) Applicant: REALTEK SEMICONDUCTOR CORPORATION, Hsinchu (TW)

(72) Inventors: Yu-Xuan Huang, Hsinchu (TW); Liang-Wei Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/914,531

(22) Filed: Jun. 29, 2020

(30) Foreign Application Priority Data

Mar. 12, 2020 (TW) .............................. 109108237 A

(51) Int. Cl.
*H04B 5/00* (2006.01)
*H04B 1/12* (2006.01)
*H04L 7/00* (2006.01)
*H04L 25/03* (2006.01)

(52) U.S. Cl.
CPC ............ *H04B 1/123* (2013.01); *H04L 7/0062* (2013.01); *H04L 25/03828* (2013.01); *H04B 5/0037* (2013.01)

(58) Field of Classification Search
CPC ... H04L 5/0007; H04L 5/001; H04L 25/0226; H04L 5/0048; H04L 27/2607; H04L 27/2613; H04L 27/2626; H04L 27/2678; H04L 25/0202; H04L 27/2627; H04L 27/2655; H02J 50/10; H02J 50/12; H02J 50/80; H02J 50/90; H02J 50/40; H02J 50/402; H02J 7/02; H02J 3/382; H02J 50/60; H02J 7/00034; H04B 5/0037; H04B 15/00; H04B 1/1027; H04B 7/0413; H04B 17/336; H04B 2001/1045; H04B 2001/1063; H04B 5/0075; H04B 7/0617; H04B 7/18513
USPC .......................................................... 375/350
See application file for complete search history.

(56) References Cited

U.S. PATENT DOCUMENTS

| | | | |
|---|---|---|---|
| 9,608,640 B1* | 3/2017 | Matsubara | .............. H03L 7/091 |
| 2010/0020250 A1* | 1/2010 | Okamoto | .............. H04L 7/0331 |
| | | | 348/739 |
| 2011/0019091 A1* | 1/2011 | Chiang | ................... H03L 7/091 |
| | | | 348/537 |
| 2012/0028593 A1* | 2/2012 | Nakata | ................... H04B 7/084 |
| | | | 455/150.1 |

(Continued)

*Primary Examiner* — Eva Y Puente
(74) *Attorney, Agent, or Firm* — WPAT, PC

(57) ABSTRACT

The present disclosure provides a signal receiving apparatus having anti-RFI mechanism that includes an ADC circuit, an equalization circuit and a clock recovery circuit. The ADC circuit performs conversion of an input analog signal according to an internal clock signal, to generate an input digital signal. The equalization circuit equalizes the input digital signal such that the clock recovery circuit adjusts a phase of the internal clock signal and extracts a frequency by performing statistics on phase deviation amount information in a unit of a time window. The clock recovery circuit discards a corresponding phase deviation amount when a signal interference parameter of one of a sub time window is larger than a threshold value to update the phase deviation amount information, and generates an adjusting signal to adjust a frequency of the internal clock signal accordingly.

12 Claims, 2 Drawing Sheets

(56) References Cited

U.S. PATENT DOCUMENTS

2014/0004812 A1\* 1/2014 Haub .................. H04B 1/1036
455/226.1

\* cited by examiner

SIGNAL RECEIVING APPARATUS AND METHOD HAVING ANTI-RFI MECHANISM

BACKGROUND OF THE INVENTION

1. Field of the Invention

The present disclosure relates to a signal receiving apparatus and a signal receiving method having anti-RFI mechanism.

2. Description of Related Art

In some communication systems, the data is received by using clock recovery technology. More specifically, the clock recovery technology extracts the frequency information of a signal transmitting terminal from a data stream at the signal receiving terminal. The received data can be decoded by using the extracted information.

An additional delay may occur in a transmission channel between the signal transmitting terminal and the signal receiving terminal due to the effect of such as, but not limited to, temperature. As a result, the clock recovery technology needs to keep calibrating the extracted frequency information. However, in some scenarios, an electronic device that delivers radio frequency signals may pass by the neighboring area of the signal receiving terminal. An instant radio frequency interference (RFI) thus occurs. Under such a circumstance, the frequency information extracted at the signal receiving terminal oscillates due to the RFI when there is no efficient anti-RFI mechanism. As a result, the signal can not be decoded accurately.

SUMMARY OF THE INVENTION

In consideration of the problem of the prior art, an object of the present disclosure is to provide a signal receiving apparatus and a signal receiving method having anti-RFI mechanism.

The present disclosure provides a signal receiving apparatus having anti-radio frequency interference (RFI) mechanism that includes an analog to digital converter (ADC) circuit, an equalization circuit and a clock recovery circuit. The analog to digital converter (ADC) circuit is configured to perform an analog to digital conversion on an input analog signal from a transmission channel, according to an internal clock signal, to generate an input digital signal. The equalization circuit is configured to equalize the input digital signal, to generate an equalized input signal. The clock recovery circuit is configured to perform calculation on the equalized input signal to adjust a phase of the internal clock signal, and to extract a frequency by performing statistics on phase deviation amount information in a unit of a time window, wherein the phase deviation amount information includes multiple phase deviation amounts, and the time window includes multiple sub time windows, such that each of the phase deviation amounts corresponds to one of the sub time windows. The clock recovery circuit is further configured to determine a signal interference parameter of a desired one of the sub time windows, such that when the signal interference parameter is larger than a threshold value, the clock recovery circuit discards a desired one of the phase deviation amounts corresponding to the desired one of the sub time windows, to generate an updated phase deviation amount information. The clock recovery circuit is further configured to generate an adjusting signal, according to the updated phase deviation amount information, to adjust a frequency of the internal clock signal.

The present disclosure also provides a signal receiving method having anti-RFI mechanism used in a signal receiving apparatus that includes the steps outlined below. An analog to digital conversion is performed on an input analog signal from a transmission channel, by an analog to digital converter (ADC) circuit, according to an internal clock signal, to generate an input digital signal. The input digital signal is equalized, by an equalization circuit, to generate an equalized input signal; performing calculation on the equalized input signal, by a clock recovery circuit, to adjust a phase of the internal clock signal, and to extract a frequency by performing statistics on phase deviation amount information in a unit of a time window. The phase deviation amount information includes multiple phase deviation amounts, and the time window includes multiple sub time windows, such that each of the phase deviation amounts corresponds to one of the sub time windows. A signal interference parameter of a desired one of the sub time windows is determined, by the clock recovery circuit, such that when the signal interference parameter is larger than a threshold value, the clock recovery circuit discards a desired one of the phase deviation amounts corresponding to the desired one of the sub time windows, to generate an updated phase deviation amount information. An adjusting signal is generated, by the clock recovery circuit, according to the updated phase deviation amount information, to adjust a frequency of the internal clock signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present disclosure is to provide a signal receiving apparatus and a signal receiving method having anti-RFI mechanism to avoid a large frequency deviation generated based on the misjudgment caused by radio frequency interference.

Figure 1:
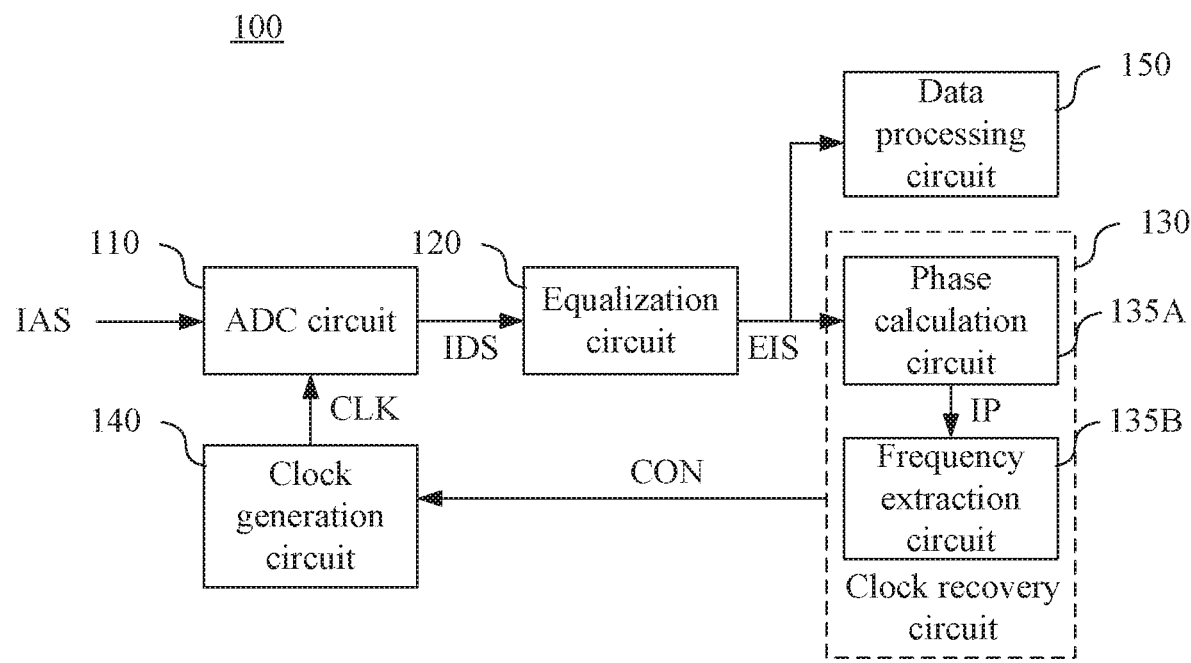
FIG. 1 illustrates a block diagram of a signal receiving apparatus having an anti-radio frequency interference (RFI) mechanism according to an embodiment of the present disclosure.

Reference is now made to FIG. 1. FIG. 1 illustrates a block diagram of a signal receiving apparatus 100 having anti-radio frequency interference (RFI) mechanism according to an embodiment of the present disclosure. The signal receiving apparatus 100 is configured to perform communication with a signal transmitting terminal (not illustrated) through a transmission channel. More specifically, the signal transmitting terminal generates a signal according to an internal clock signal therein, such that the signal receiving apparatus 100 receives the signal in the form of an input analog signal IAS, through the transmission channel.

The signal receiving apparatus 100 includes an analog to digital converter (ADC) circuit 110, an equalization circuit 120, and a clock recovery circuit 130.

The ADC circuit 110 is configured to sample the input analog signal IAS according to an internal clock signal CLK, to perform an analog to digital conversion thereon, to generate an input digital signal IDS. In an embodiment, the internal clock signal CLK can be generated by a clock generation circuit 140 included in the signal receiving apparatus 100.

The equalization circuit 120 is configured to equalize the input digital signal IDS, to generate an equalized input signal EIS. In an embodiment, the equalization performed by the equalization circuit 120 is configured to eliminate the inter-symbol interference (ISI) generated by the transmission channel.

In an embodiment, the equalization circuit 120 further transmits the equalized input signal EIS to a data processing circuit 150 included in the signal receiving apparatus 100 to be further processed. In an embodiment, the signal transmitting terminal described above encodes the signal by using pulse-amplitude modulation (PAM) technology. As a result, the data processing circuit 150 may include modules of such as, but not limited to, a data slicer and a data decision circuit (not illustrated), to determine the content of the data by determining the amplitude of the equalized input signal EIS.

The clock recovery circuit 130 is configured to perform clock recovery according to the equalized input signal EIS, to reconstruct the clock signal that the signal transmitting terminal used to perform signal transmission. In an embodiment, the clock recovery circuit 130, based on Mueller-Müller clock recovery technology, performs frequency extraction on the equalized input signal EIS in a unit of a time window. The clock recovery circuit 130 further determines a phase difference between the equalized input signal EIS and the clock signal of the signal transmitting terminal, to generate an adjusting signal CON to the clock generate circuit 140. The clock signal generation circuit 140 further adjusts the internal clock signal CLK accordingly, such that the frequency of the internal clock signal CLK approximates the frequency of the clock signal of the signal transmitting terminal.

Additionally, in some embodiments, the clock recovery circuit 130 accumulates a phase deviation amount at least in one unit time of phase detection. When an absolute value of the accumulated phase deviation amount is larger than a predetermined value, the clock recovery circuit 130 delivers the adjusting signal CON to the clock signal generation circuit 140, to adjust the phase of the internal clock signal CLK.

Figure 2:
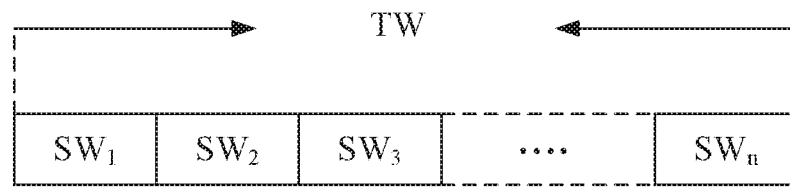
FIG. 2 illustrates a diagram of a time window according to an embodiment of the present disclosure.

Reference is now made to FIG. 2. FIG. 2 illustrates a diagram of a time window TW according to an embodiment of the present disclosure.

As illustrated in FIG. 2, the time window TW includes a plurality of sub time windows $SW_1 \sim SW_n$. In an embodiment, a time length of each of the sub time windows $SW_1 \sim SW_n$ is at least a hundred times of the unit time of phase detection, performed by Mueller-Müller clock recovery technology. In a numerical example, the unit time of phase detection performed by Mueller-Müller clock recovery technology is such as, but not limited to, 5 nanoseconds. The phase detection is performed within such unit time such that the phase adjustment is performed accordingly.

It is appreciated that the value described above is merely an example. In other embodiments, the time length of each of the sub time windows $SW_1 \sim SW_n$ can be any value that is larger than hundred times of the unit time of phase detection. As a result, in an embodiment, the time length of each of the sub time windows $SW_1 \sim SW_n$ is such as, but not limited to, 5 microseconds, which is a thousand times of the unit time of phase detection performed by Mueller-Müller clock recovery technology.

In an embodiment, the time window TW includes such as, but not limited to, 8 sub time windows $SW_1 \sim SW_n$ (i.e., n is 8). As a result, the time length of the time window TW is such as, but not limited to, 40 microseconds.

In an embodiment, the clock recovery circuit 130 performs calculation on the equalized input signal EIS to adjust the phase of the internal clock signal CLK. From the change of phase of the equalized input signal EIS along with time, a zero-order term and a first-order term can be observed. The zero-order term is a phase term such as, but not limited to, a phase difference generated by the effect of the temperature on the transmission channel. The first-order term is a frequency term such as, but not limited to, a frequency difference between the clock signals in the signal receiving apparatus 100 and the signal transmitting terminal.

In an embodiment, by performing statistics, the frequency deviation caused by the frequency term (the first-order term) requires a longer time to extract the frequency term related to the signal receiving apparatus 100 and the signal transmitting terminal. As a result, the clock recovery circuit 130 extracts the frequency by performing statistics on equalized input signal EIS. The statistics is performed to obtain the phase deviation amount (treated as phase deviation amount information), of all the sub time windows $SW_1 \sim SW_n$, in the unit of the time window having a longer time. The clock recovery circuit 130 further generates the adjusting signal CON accordingly to the clock signal generation circuit 140, to adjust the frequency of the internal clock signal CLK, and further eliminate the difference of the first-order term.

On the other hand, the phase deviation caused by the phase term (zero-order term) requires a shorter time to perform statistics, in order to perform an instant adjustment. For example, the clock recovery circuit 130 accumulates the phase deviation amount in at least one unit time of phase detection. When the absolute value of the accumulated phase deviation amount is larger than a predetermined value, the clock recovery circuit 130 delivers the adjusting signal CON to the clock signal generation circuit 140. The clock signal generation circuit 140 adjusts the phase of the internal clock signal CLK accordingly.

As a result, the clock recovery circuit 130 is configured to determine a signal interference parameter of any one of the sub time windows $SW_1 \sim SW_n$. In some embodiments, in order to accomplish the anti-FRI mechanism, a phase calculation circuit 135A generates the adjusting signal CON according to the phase deviation amount in the sub time window only when the signal interference parameter is smaller than a threshold value. The adjusting signal CON is further used to adjust the phase of the internal clock signal CLK, to eliminate the difference of the zero-order term. Further, the phase deviation amount is used by a frequency extraction circuit 135B to perform statistics. The clock recovery circuit 130 further generates the adjusting signal CON accordingly to adjust the frequency of the internal clock signal CLK. In some embodiments, an instant change of the phase is taken into consideration during the performance of statistics. As a result, in actual implementation, the clock recovery circuit 130 may selectively restore the adjusted phase to a previous time spot when necessary.

In a practical implementation, in an embodiment, the clock recovery circuit 130 may include different circuit blocks to realize the phase calculation circuit 135A and the frequency extraction circuit 135B described above. The phase calculation circuit 135A is configured to perform calculation on the equalized input signal EIS to retrieve the phase IP. According to the phase IP, the frequency extraction circuit 135B performs statistics on the phase deviation amount information in the unit of the time window, and extracts frequency from the equalized input signal EIS. The phase deviation amount information includes a plurality of phase deviation amounts. The phase deviation amounts correspond to the sub time windows.

Moreover, the frequency extraction circuit 135B determines the signal interference parameter of each of the sub time windows, to generate the adjusting signal CON to adjust the frequency of the internal clock signal CLK. In an embodiment, the phase deviation amount is directional and can be expressed by using positive values or negative values, that either stand for a phase-leading condition or a phase-lagging condition.

In an embodiment, the signal interference parameter of a sub time window is a difference between the phase deviation amount of such sub time window and a former phase deviation amount of a former sub time window, or between the phase deviation amount of such sub time window and a latter phase deviation amount of a latter sub time window. In an embodiment, the signal interference parameter of a sub time window is a difference between a signal-to-noise ratio (SNR) of the such sub time window and a predetermined SNR. The predetermined SNR is an average SNR of a former sub time window, a latter sub time window, or the time window.

In one scenario, during the operation of the signal receiving apparatus 100, an RFI is generated due to either an intercom or other devices presented in the neighboring area. An instant oscillation having large amplitude occurs to the equalized input signal EIS. The clock recovery circuit 130 therefore detects a large phase deviation amount in the corresponding sub time window. If there is no efficient anti-RFI mechanism, the clock recovery circuit 130 is not able to obtain the actual frequency deviation between the signal receiving apparatus 100 and the signal transmitting terminal. The system may crash accordingly.

As a result, the clock recovery circuit 130 determines the occurrence of the RFI in the sub time window when the signal interference parameter is larger than the threshold value. The clock recovery circuit 130 discards the phase deviation amount corresponding to the sub time window having the RFI present, without adjusting the frequency of the internal clock signal CLK accordingly. The misjudgment caused due to the RFI can be avoided.

In an embodiment, the phase is taken into consideration during the performance of statistics when the phase is changed. As a result, in actual implementation, when the RFI occurs in the sub time window, the clock recovery circuit 130 may selectively restore the adjusted phase to a previous time spot. For example, the clock recovery circuit 130 may adjust the phase to a current value in the next sub time window according to the phase adjusting amount corresponding to the current sub time window.

On the other hand, when the RFI does not occur, the clock recovery circuit 130 generates the adjusting signal CON according to the intensity and the direction of the phase deviation amount, to adjust the phase of the internal clock signal CLK to accomplish the clock recovery mechanism.

In some approaches, the clock recovery technology adapted by the signal receiving apparatus determines the phase deviation information according to every tiny unit time of phase detection, and performs phase adjustment accordingly. When the RFI occurs, a misjudgment is easily made, such that the frequency is adjusted to deviate from the actual clock frequency of the transmitting terminal. A chain reaction that results in system crash may further occur.

On the contrary, the signal receiving apparatus of the present disclosure uses a longer time window to extract the phase deviation information. The phase detections that are frequently performed and are easily affected are reduced. Further, by determining the signal interference parameter, the phase deviation amount corresponding to the occurrence of the RFI is discarded, and he phase of the clock signal is not adjusted accordingly. Not only the frequency extraction is not affected since only a part of the sub time windows within in the longer time window are discarded, but also the misjudgment generated due to the RFI can be avoided.

Figure 3:
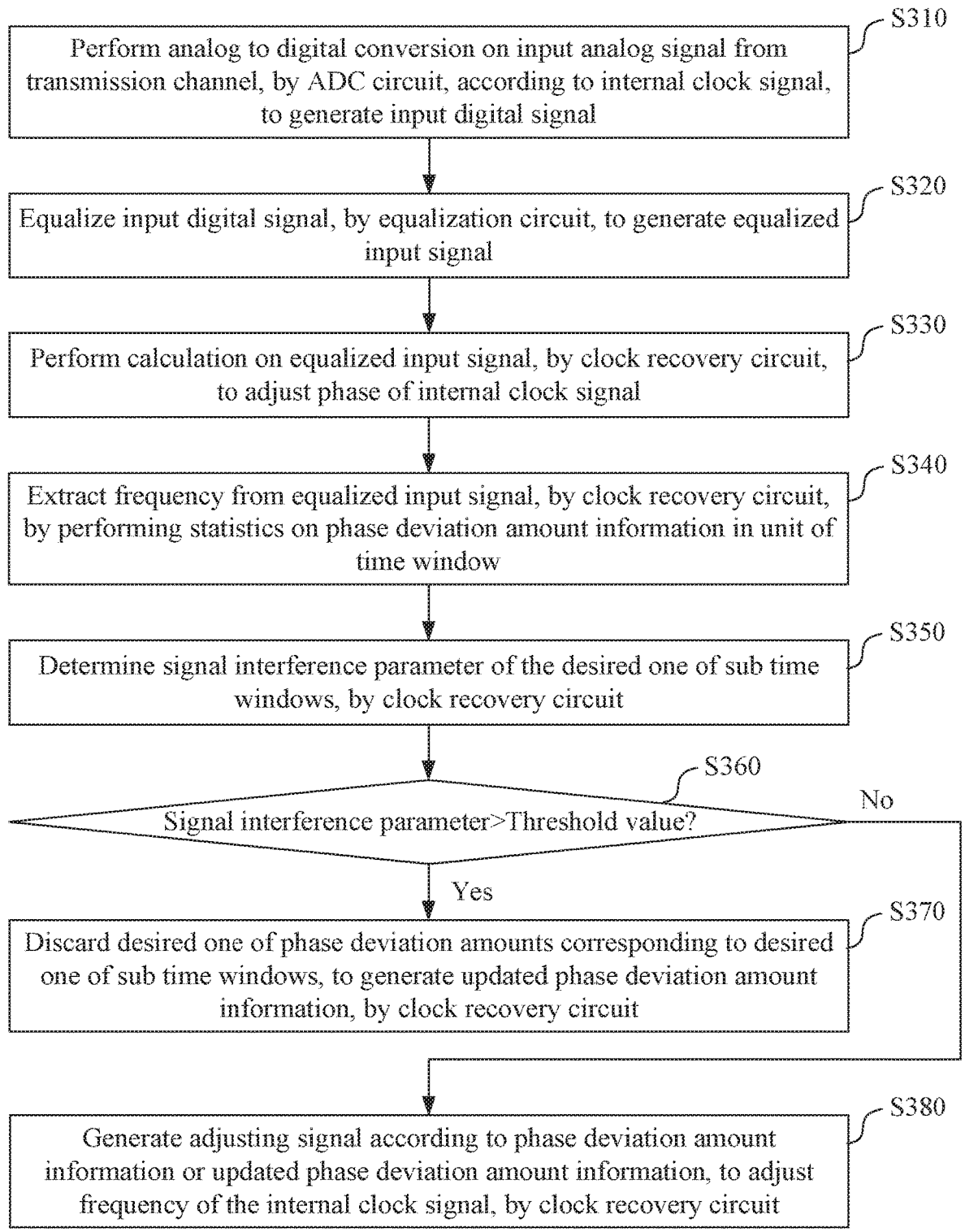
FIG. 3 illustrates a flow chart of a signal receiving method according to an embodiment of the present disclosure.

Reference is now made to FIG. 3. FIG. 3 illustrates a flow chart of a signal receiving method 300 according to an embodiment of the present disclosure.

In addition to the apparatus described above, the present disclosure further provides the signal receiving method 300 that can be used in such as, but not limited to, the signal receiving apparatus 100 in FIG. 1. As illustrated in FIG. 3, an embodiment of the signal receiving method 300 includes the following steps.

In step S310, the analog to digital conversion is performed on the input analog signal IAS from the transmission channel, by the ADC circuit 110, according to the internal clock signal CLK, to generate the input digital signal IDS.

In step S320, the input digital signal IDS is equalized, by the equalization circuit 120, to generate the equalized input signal EIS.

In step S330, calculation is performed on the equalized input signal EIS, by the clock recovery circuit 130, to adjust the phase of the internal clock signal CLK.

In step S340, a frequency is extracted from the equalized input signal EIS, by the clock recovery circuit 130, by performing statistics on the phase deviation amount information in the unit of the time window (e.g., the time window TW in FIG. 2). The phase deviation amount information includes a plurality of phase deviation amounts. The time window includes a plurality of sub time windows. The phase deviation amounts correspond to the sub time windows respectively.

In step S350, the signal interference parameter of a desired one of the sub time windows (e.g., one of the sub time windows $SW_1$~$SW_n$) is determined, by the clock recovery circuit 130.

In step S360, whether the signal interference parameter is larger than the threshold value is determined by the clock recovery circuit 130.

In step S370, when the signal interference parameter is larger than the threshold value, the clock recovery circuit 130 discards the desired one of the phase deviation amounts corresponding to the desired one of the sub time windows, to generate an updated phase deviation amount information.

In step S380, when the signal interference parameter is smaller than the threshold value, the clock recovery circuit 130 generates the adjusting signal CON according to the phase deviation amount information or the updated phase deviation amount information, to adjust the frequency of the internal clock signal CLK.

It is appreciated that the embodiments described above are merely an example. In other embodiments, it should be appreciated that many modifications and changes may be made by those of ordinary skill in the art without departing, from the spirit of the disclosure.

In summary, the signal receiving apparatus and the signal receiving method having anti-RFI mechanism of the present disclosure can use a longer time window to extract the phase deviation information. The phase detections that are frequently performed and are easily affected are reduced. Further, by determining the signal interference parameter, the phase deviation amount corresponding to the occurrence of the RFI is discarded. The misjudgment generated due to the RFI can be avoided.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A signal receiving apparatus having anti-radio frequency interference (RFI) mechanism comprising:
    an analog to digital converter (ADC) circuit configured to perform an analog to digital conversion on an input analog signal from a transmission channel, according to an internal clock signal, to generate an input digital signal;
    an equalization circuit configured to equalize the input digital signal, to generate an equalized input signal; and
    a clock recovery circuit configured to perform calculation on the equalized input signal to adjust a phase of the internal clock signal, and to extract a frequency by performing statistics on phase deviation amount information in a unit of a time window, wherein the phase deviation amount information comprises a plurality of phase deviation amounts, and the time window comprises a plurality of sub time windows, such that each of the phase deviation amounts corresponds to one of the sub time windows;
    wherein the clock recovery circuit is further configured to determine a signal interference parameter of a desired one of the sub time windows, such that when the signal interference parameter is larger than a threshold value, the clock recovery circuit discards a desired one of the phase deviation amounts corresponding to the desired one of the sub time windows, to generate an updated phase deviation amount information;
    wherein the clock recovery circuit is further configured to generate an adjusting signal, according to the updated phase deviation amount information, to adjust a frequency of the internal clock signal.

2. The signal receiving apparatus of claim 1, wherein the signal interference parameter is a difference between the desired one of the phase deviation amounts and a former phase deviation amount of a former sub time window, or between the desired one of the phase deviation amounts and a latter phase deviation amount of a latter sub time window.

3. The signal receiving apparatus of claim 1, wherein the signal interference parameter is a difference between a signal-to-noise ratio (SNR) of the desired one of the sub time windows and a predetermined SNR.

4. The signal receiving apparatus of claim 3, wherein the predetermined SNR is an average SNR of a former sub time window, a latter sub time window or the time window.

5. The signal receiving apparatus of claim 1, wherein a time length of each of the sub time windows is at least a hundred times of a unit time of phase detection performed by Mueller-Müller clock recovery technology.

6. The signal receiving apparatus of claim 1, wherein when the signal interference parameter of each of the sub time window is smaller than the threshold value, the clock recovery circuit generates the adjusting signal according to the phase deviation amount information, to adjust a frequency of the internal clock signal.

7. A signal receiving method having anti-RFI mechanism used in a signal receiving apparatus comprising:
    performing an analog to digital conversion on an input analog signal from a transmission channel, by an analog to digital converter (ADC) circuit, according to an internal clock signal, to generate an input digital signal;
    equalizing the input digital signal, by an equalization circuit, to generate an equalized input signal;
    performing calculation on the equalized input signal, by a clock recovery circuit, to adjust a phase of the internal clock signal, and to extract a frequency by performing statistics on phase deviation amount information in a unit of a time window, wherein the phase deviation amount information comprises a plurality of phase deviation amounts, and the time window comprises a plurality of sub time windows, such that each of the phase deviation amounts corresponds to one of the sub time windows;
    determining a signal interference parameter of a desired one of the sub time windows, by the clock recovery circuit, such that when the signal interference parameter is larger than a threshold value, the clock recovery circuit discards a desired one of the phase deviation amounts corresponding to the desired one of the sub time windows, to generate an updated phase deviation amount information; and
    generating an adjusting signal, by the clock recovery circuit, according to the updated phase deviation amount information, to adjust a frequency of the internal clock signal.

8. The signal receiving method of claim 7, wherein the signal interference parameter is a difference between the desired one of the phase deviation amounts and a former phase deviation amount of a former sub time window, or between the desired one of the phase deviation amounts and a latter phase deviation amount of a latter sub time window.

9. The signal receiving method of claim 7, wherein the signal interference parameter is a difference between a signal-to-noise ratio (SNR) of the desired one of the sub time windows and a predetermined SNR.

10. The signal receiving method of claim 9, wherein the predetermined SNR is an average SNR of a former sub time window, a latter sub time window or the time window.

11. The signal receiving method of claim 7, wherein a time length of each of the sub time windows is at least a hundred times of a unit time of phase detection performed by Mueller-Müller clock recovery technology.

12. The signal receiving method of claim 7, further comprising:
    when the signal interference parameter of each of the sub time window is smaller than the threshold value, generating the adjusting signal, by the clock recovery circuit, according to the phase deviation amount information, to adjust a frequency of the internal clock signal.

* * * * *